United States Patent [19]

Jones

[11] Patent Number: 5,894,496
[45] Date of Patent: Apr. 13, 1999

[54] METHOD AND APPARATUS FOR DETECTING AND COMPENSATING FOR UNDESIRED PHASE SHIFT IN A RADIO TRANSCEIVER

[75] Inventor: Mark Alan Jones, Forest, Va.

[73] Assignee: Ericsson Inc., Research Triangle Park, N.C.

[21] Appl. No.: 08/714,699

[22] Filed: Sep. 16, 1996

[51] Int. Cl.⁶ .................... H04B 1/04; H03F 1/32
[52] U.S. Cl. .................. 455/126; 330/109; 375/261
[58] Field of Search .................... 375/219, 221, 375/261, 279, 281, 295–298, 308; 455/119, 126, 127; 330/107, 109, 149

[56] References Cited

U.S. PATENT DOCUMENTS

| | | |
|---|---|---|
| 4,079,318 | 3/1978 | Kinoshita . |
| 5,066,923 | 11/1991 | Kinoshita . |
| 5,381,108 | 1/1995 | Whitmarsh et al. ............ 330/2 |
| 5,420,536 | 5/1995 | Faulkner et al. ............ 330/149 |
| 5,483,681 | 1/1996 | Bergsten et al. ............ 455/126 |
| 5,507,017 | 4/1996 | Whitmarsh et al. ............ 455/126 |
| 5,551,070 | 8/1996 | Skarby et al. ............ 455/126 |
| 5,623,226 | 4/1997 | Whitmarsh et al. ............ 330/2 |
| 5,722,056 | 2/1998 | Horowitz et al. ............ 435/126 |
| 5,748,037 | 5/1998 | Rozental et al. ............ 330/2 |

FOREIGN PATENT DOCUMENTS

| | | |
|---|---|---|
| 0 706 259 | 4/1996 | European Pat. Off. . |
| 40 12 199 | 10/1991 | Germany . |
| 94/05078 | 3/1994 | WIPO . |

*Primary Examiner*—Jason Chan
*Assistant Examiner*—Jean B. Corrielus
*Attorney, Agent, or Firm*—Nixon & Vanderhye P.C.

[57] ABSTRACT

The present invention provides a method and apparatus for detecting and compensating for transmitter phase shift in a radio transmitter. A local oscillator generates a local oscillator signal. A modulator such as an I/Q modulator modulates input signals onto the local oscillator signal to generate a forward signal. That forward signal is amplified and otherwise prepared for transmission via an antenna. The transmitted signal is detected, and a phase adjuster substantially continuously detects and cancels undesired phase shifts in the detected signal caused by elements in the radio chain. A specific, example embodiment of the present invention is provided in a Cartesian feedback system wherein the phase of the feedback signal is detected and aligned with the phase of the original modulated signal, providing uncorrupted I and Q baseband feedback signals.

12 Claims, 5 Drawing Sheets

METHOD AND APPARATUS FOR DETECTING AND COMPENSATING FOR UNDESIRED PHASE SHIFT IN A RADIO TRANSCEIVER

FIELD OF THE INVENTION

The present invention relates to a method and apparatus for detecting and compensating for undesirable phase shifts, and more particularly, to a method and apparatus that substantially continuously detects and cancels undesired phase shifts introduced in a radio transceiver.

BACKGROUND AND SUMMARY OF THE INVENTION

Radio transmitter power amplifiers, like any electrical components in the radio transmitter chain, can produce distortion in the signal to be transmitted. An undesirable byproduct of the distortion produced by a radio frequency power amplifier is spectral regrowth. FIG. 1(A) illustrates an example of a desired transmit channel frequency band in which the originally transmitted signal should be contained. However, as a result of distortion in the radio power amplifier, spectral regrowth occurs as shown in FIG. 1(B) with a considerable portion of transmitted power falling outside of the desired or permitted transmission band for that radio.

Such spectral regrowth is inherent in spectrally efficient linear modulation techniques such as quadrature phase shift keying (QPSK), quadrature amplitude modulation (QAM), and π/4 differential quadrature phase shift keying (π/4-DQPSK). These modulations are generally very spectrally efficient providing a high ratio of data rate per frequency spectrum used. In general, linear modulation is any modulation which produces changes in the amplitude of the output signal in contrast with angle modulation (e.g., frequency modulation or phase modulation) where only the phase of the signal varies and the amplitude remains constant. Unfortunately, non-linearities in the signal path (produced for example by the power amplifier) cause problems for linear modulation formats in the sense that the transmitted frequency spectrum spreads out and interferes with transmissions on adjacent radio channels.

Cartesian feedback loops may be used to linearize one or more amplifiers of the transmitter amplifier chain. The term "linearize" is used here in the sense that feedback is used to reduce or eliminate distortion products generated or caused by the transmitter amplifier chain. In Cartesian feedback linearization, the radio transmitter power amplifier output is detected, downconverted from radio frequency, and broken down into its in-phase (I) and quadrature (Q) components by an I/Q demodulator. The downconverted I and Q components are then subtracted from the input I and Q signals leaving two residual error signals. These error signals contain the unwanted distortion terms generated by the power amplifier chain. Negative feedback is used to reduce these error signals hopefully to zero.

The term "Cartesian feedback" is derived from quadrature modulation. In quadrature modulation, there are two independent orthogonal modulating input signal referred to as the in-phase (I) and quadrature (Q) signals modulating onto a single carrier. The I signal is multiplied by a cosine wave at the carrier frequency, and the Q signal by a sine wave carrier. The resultant signals are added to form the composite I/Q modulated signal. Quadrature or I/Q modulation may therefore be viewed as the vector addition of two orthogonal signals, a real component representing the x-axis component in a Cartesian coordinate system and an imaginary component representing the y-axis component. Thus, the similarity of I/Q modulation in the complex domain to two-dimensional Cartesian coordinates gives rise to the name Cartesian feedback.

Radio frequency power amplifiers produce not only distortion products but also phase shifts because of finite time delays in signal propagation. Phase shifts are also caused by cables (e.g., approximately 45° of phase shift per inch of cable for a 1 GHz signal), filters, power splitters/combiners, and almost an component associated with coupling RF signals to and from a power amplifier. One difficulty with these phase shifts is that they are generally unknown and are affected by temperature shifts, frequency shifts, power supply drift, and other factors that are generally variable and difficult to predict.

Such phase shifts are particularly problematic in a feedback-based system. In general, uncompensate phase shifts degrade the performance of the feedback loop causing excess noise output, spurious outputs, and/or system instability. More specifically, in a Cartesian feedback loop, if the phase shift were as much as 90°, the demodulated in-phase component (I) would be "replaced" by the demodulated quadrature component (Q). As a result, none of the correct signal would be fed back rendering the feedback loop completely inoperative. In practice, even phase shifts of 15° or more are difficult to tolerate.

One approach to dealing with these undesired phase shifts is to initially try to measure the phase shift in a calibration routine and introduce the opposite phase shift detected during the calibration routine into the loop using, for example, a digital phase shifter. However, this approach would be disadvantageous in that the calibration routine is time consuming and assumes that the phase shift is completely constant over time and environmental variables. This assumption is not correct, and thus, the approach would not compensate for the actual phase shift in real time. Moreover, digital phase shifters have limited resolution which limits the accuracy of the phase compensation. Another difficulty with this approach is presented each time the radio is modified, e.g., a transmitter board, power amplifier, cable, etc. is replaced, requiring recalibration.

It is an object of the present invention to provide a method and apparatus for compensating for unwanted phase shifts without suffering the disadvantages and limitations note above. For example, it is an object of the present invention to continuously track and cancel unwanted phase shifts in a radio transmitter chain using a technique and circuitry that is inherently self-calibrating, adaptive, and highly accurate. In a feedback-based transmission system, it is another object of the present invention that such phase shift tracking and cancelling techniques and circuitry do not adversely impact the transmitter feedback loop.

In the context of a feedback based radio frequency transmission system, the present invention provides a method for substantially continuously tracking and cancelling in real time unwanted phase shifts caused by the radio frequency transmitter chain. Initially, a carrier signal is modulated with a difference or error signal based on an input signal and transmitted. The transmitted signal is detected and demodulated to generate a feedback signal. The difference between an input signal and the feedback signal is determined to generate the difference signal. The phase of the detected feedback signal is substantially continuously compensated for undesired phase shifts.

A radio transmitter in accordance with the present invention includes a local oscillator for generating a local oscillator signal, a modulator for modulating input signals onto the local oscillator signal to generate a forward signal, a power amplifier for amplifying the forward signal, and an antenna or other transmission medium for transmitting the amplified signal. A coupler, power splitter, or other sampling device is used to detect the transmitted signal. A quadrature demodulator demodulates the detected signal in accordance with the local oscillator signal whose phase has been adjusted by a phase adjuster connected to the local oscillator and the detector. Demodulating the detected signal using the phase adjusted local oscillator signal effectively cancels undesired phase shifts in the quadrature demodulator detected signal.

In the example embodiment of the present invention as applied to a Cartesian feedback system, the modulator is a first quadrature modulator for modulating in-phase (I) and quadrature (Q) signals. The demodulator is a quadrature demodulator that generates feedback in-phase and quadrature signals that are combined with the input in-phase and quadrature signals in corresponding combiners. Thus, the in-phase and quadrature signals provided for the quadrature modulator are difference or error signals generated by the feedback loop.

The phase adjuster in the example Cartesian feedback embodiment includes a second quadrature demodulator. The forward signal is connected to one input port of the second quadrature demodulator, and the sampled or feedback signal is connected to another input port. The second quadrature demodulator generates second set of in-phase and quadrature signals which carry information about the phase shift of the incoming feedback signal. The peak amplitude of these signals are detected by corresponding peak detectors. A second quadrature modulator receives at its in-phase and quadrature input ports the output signals from the first and second peak detectors as well as the local oscillator signal and generates a phase adjusted local oscillator signal.

The second demodulator can be viewed in this example embodiment as a four quadrant phase comparator with the unknown phase shift between the forward and detected signals appearing at its in-phase and quadrature outputs in the four quadrant complex phase plane similar to the Cartesian coordinate system as described above. Since these I and Q outputs are modulated in amplitude by the signal modulation, the peak detectors remove the amplitude modulation components leaving only phase shift information. Mathematically, this is given by (unwanted phase)=arc tan (Q/I), where Q=output of peak detector "Q" and I=output of peak detector "I". The undesired phase shift information from the detected signal is "passed on" to the second I/Q modulator at its I and Q inputs so that the phase of the local oscillator input to the primary I/Q demodulator in the feedback loop is identical to the phase of the detected signal. With identical phases in the local oscillator and the feedback signal, the original I and Q signals (plus distortion terms) are recovered without cross talk and with correct polarity. As a result, the unwanted phase shift or difference is effectively cancelled.

Another application of the present application for detecting and compensating for undesired phase shift is found in diversity radio receivers. In a diversity radio receiver, two or more radio receivers demodulate signals received from two or more separate antennas. The "best" signal is chosen, e.g., on the basis of greatest received signal strength indicator level (RSSI level), and the best modulated signal is passed to the next radio receiver stage, e.g., audio to a speaker, data stream to a data decoder, or a modulator/upconvertor in the case of a repeater or base station.

Diversity reception is a common technique used to reduce the effects of fading in terrestrial radio systems. When one of the antennas temporarily receives a weak or corrupted signal, typically due to destructive cancellation from multipath signal reflections, another antenna likely receives a stronger and/or clearer signal. Diversity reception is particularly advantageous for receiving signals from mobile transceivers which are used in a constantly changing environment where the occurrence of signal fading is both frequent and unpredictable.

Diversity receivers, as normally implemented, exhibit most improvement over standard receivers using only a single antenna when one incoming signal is much stronger than another. But when two signals arrive at a dual input diversity receiver at approximately the same signal level, there is little or no signal to noise ratio improvement from switching between signals. So diversity switching offers little improvement in this situation. Some diversity systems blend or mix received demodulated audio signals to obtain better performance under the same-signal conditions, but the increase in signal to noise ratio is limited to 3 dB at most.

The optimum way to use both signals to improve signal to noise ratios is to add the two signals before demodulating. Additive signal combination before demodulation under same-signal conditions provides at least 3 dB of signal to noise ratio improvement, and even more closer to the FM threshold where a small change in input signal integrity results in a large change in demodulated signal to noise ratio. But before the two diversity signals can be added effectively, they must be aligned in phase to prevent destructive interference caused by oppositely phased signals. In addition, such phase alignment must be done dynamically, since the unknown phase difference between the two signals will change with time as relative movement occurs between the transmitting radio and the receiving radio having the diversity receive antennas.

It is an object of the present invention therefore to provide a method and apparatus for compensating for such phase shifts between the two diversity receiver signals. Moreover, it is an object of the present invention to dynamically phase align diversity signals to allow for in-phase combination that results in, among other things, improved signal to noise ratio under same-signal reception conditions.

The first of two diversity antennas passes an RF received signal to the front end of a first diversity receiver which downconverts the received signal to an intermediate frequency. The same down conversion is performed in the front end of the second diversity receiver. For the reasons explained above, the two IF signal have an unknown, changing phase difference. These two IF signals are processed by an I/Q demodulator which, in conjunction with two peek detectors/low pass filters at the I/Q outputs, function as a four quadrant phase comparator. The peak detector outputs provide I and Q inputs to I/Q modulator which receives as its local oscillator input the received IF signal from one of the first and second diversity receivers. The I/Q modulator functions as a phase shifter, rotating the phase of the one received signal to match the phase of the other received signal. After the phase rotation, the two IF signals are than additively combined and routed to main radio demodulator.

BRIEF DESCRIPTION OF THE DRAWINGS

These objects and features of the present invention as well as others will now be more fully described in conjunction with the following drawings of which.

DETAILED DESCRIPTION OF THE INVENTION

In the following description for purposes of explanation and not limitation, specific details are set forth, such as particular circuits, circuit components, techniques, etc. in order to provide a thorough understanding of the present invention. However, it will be apparent to one skilled in the art that the present invention may be practiced in other embodiments that depart from these specific details. In other instances, detailed descriptions of well known methods, devices, and circuits are omitted so as not to obscure the description of the present invention with unnecessary detail.

Figure 1:
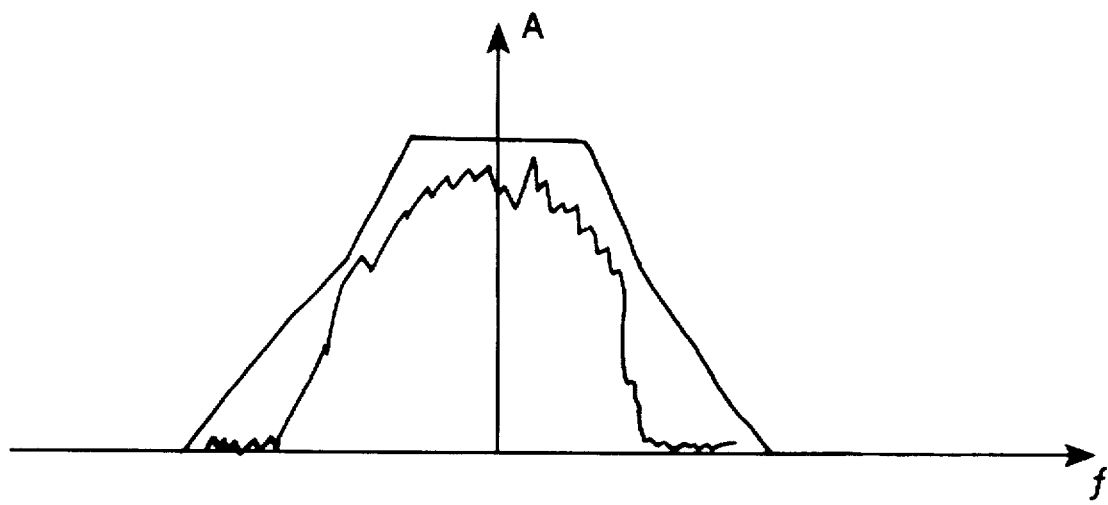
FIGS. 1(A) and 1(B) are graphs showing the frequency spectrum of transmitted signals without and with spectral regrowth, respectively.
Figure 1:
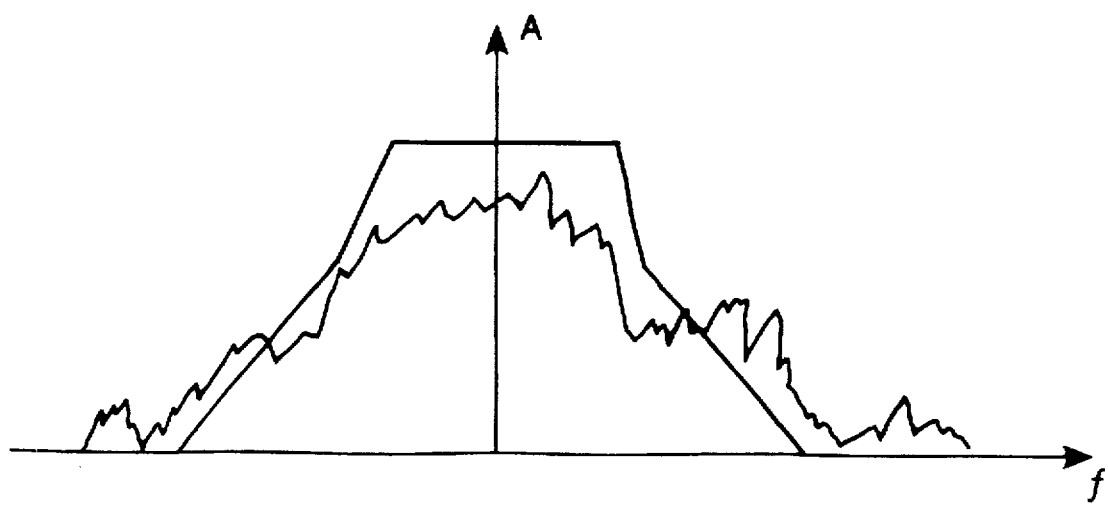
Figure 2:
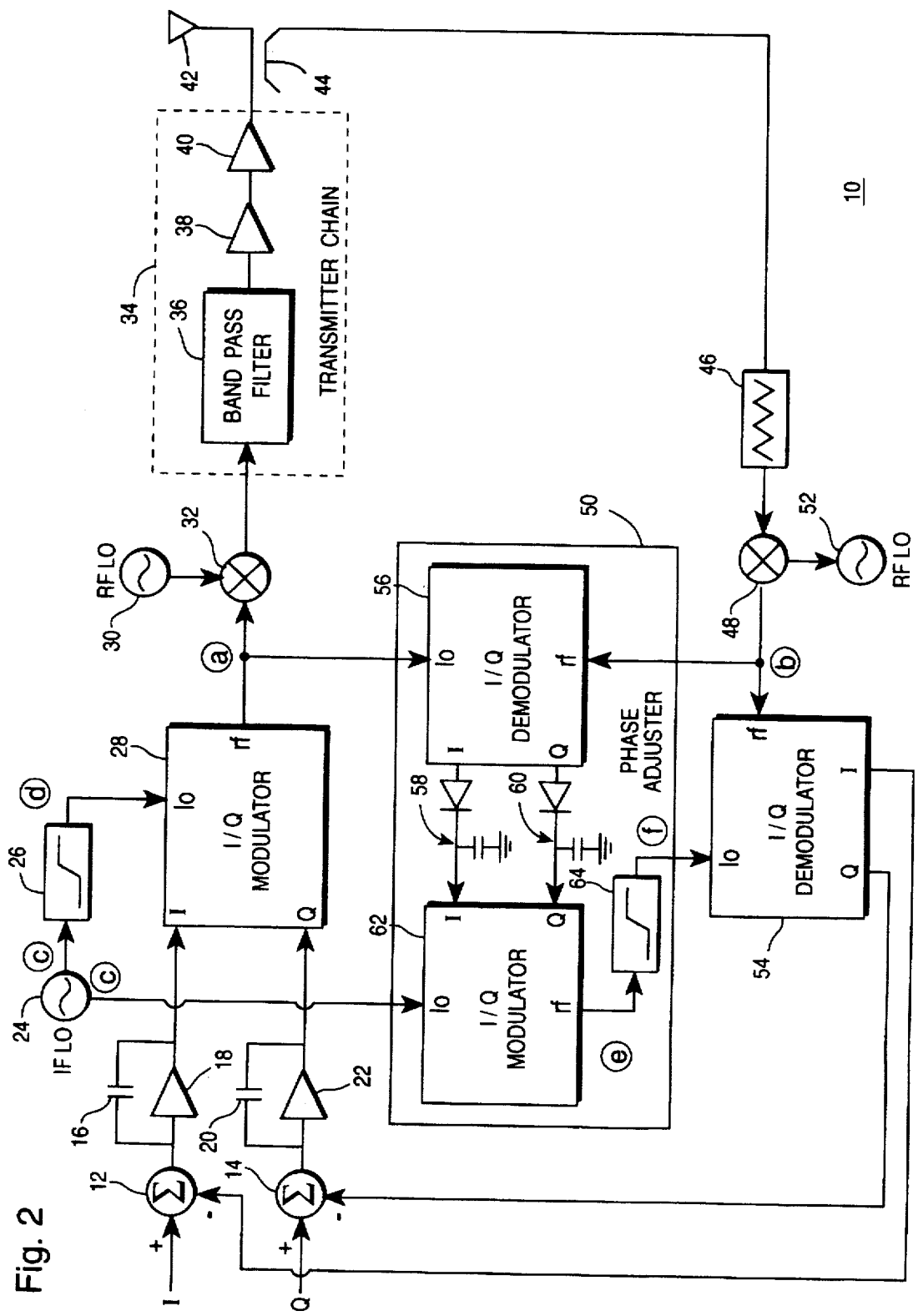
FIG. 2 is a function block diagram of one example, non-limiting application of the present invention to a Cartesian feedback-based radio transmitter.

Referring to FIG. 2, a function block diagram of the present invention as applied in a non-limiting example to a Cartesian feedback-based radio transmitter is shown. Of course, the present invention may be applied to other types of feedback-based transmission systems and devices. For the sake of illustration and brevity only, the following description of the present invention as applied to radio transmitters is provided in the context of a Cartesian feedback-based system.

Cartesian feedback radio transmitter 10 includes in-phase (I) and quadrature (Q) inputs coupled to corresponding signal combiners 12 and 14 where they are combined with corresponding in-phase and quadrature feedback signals to generate in-phase and quadrature difference or error signals. The in-phase and quadrature difference signals are provided to corresponding integrators each having an operational amplifier 18, 22 and a feedback capacitor 16, 20. These integrators essentially function as low pass, loop filters to provide inputs to quadrature (I/Q) modulator 28.

A local oscillator 24, in this example an intermediate frequency (IF) local oscillator, generates a high frequency carrier signal whose amplitude may be optionally limited in limiter 26 before being input to the local oscillator input port of I/Q modulator 28. It is preferred although not necessary that the output of I/Q modulator 28 at its RF output port be provided to a frequency upconvertor mixer 32 which converts the intermediate frequency of the modulated signal in accordance with the output of radio frequency local oscillator 30. The RF signal is then processed in transmitter chain 34 using an appropriate bandpass filter 36, the output of which is amplified in preamplifier driver 38 and ultimately in power amplifier 40 before being coupled to antenna 42 for transmission. As described above, undesired phase shifts in the modulated signal may be caused by virtually any component associated with coupling RF signals to and from a power amplifier. For example, the band pass filter 36, the preamplifier driver 38, transmission lines, and of course the power amplifier itself all cause undesirable phase shifts.

An RF directional coupler 44 is used to detect the transmitted signal. The detected signal is optionally in attenuator 46 before being downconverted to intermediate frequency. RE local oscillator 52 (which may be the same as RF local oscillator 30) generates an RF signal which is combined in mixer 48 with the detected signal to generate a downconverted, detected signal indicated in FIG. 2 by the letter B. That detected signal is received by I/Q demodulator 54 at its RF input port. The in-phase and quadrature outputs of I/Q demodulator 54 are fed back to corresponding combiners 12 and 14 to complete the feedback loop. In this advantageous implementation, the I output of I/Q demodulator 54 remains uncorrupted by the Q signal, and vice versa, regardless of the amount of unknown phase shift present in transmitter chain 34. The compensation for phase shift is accommodated by phase adjuster 50, which provides the local oscillator input to the I/Q demodulator 54. The operation of phase adjuster 50 will now be described in more detail below.

Phase adjuster 50 is responsible for adjusting the phase of the IF local oscillator 24 output signal so that it is substantially the same as the phase of the detected signal which as undesirably altered in the transmission process. A second I/Q demodulator 56 receives at a local oscillator input port the forward signal from the I/Q modulator 28 and the detected signal at an RF input port. I/Q demodulator 56 acts as a four-quadrant phase comparator in the sense that the unknown phase shift between the forward signal and the detected signal appears at the in-phase (I) and quadrature (Q) output of I/Q demodulator 56 in the complex (four-quadrant) phase plane. Because the I and Q outputs from I/Q demodulator 56 are modulated in amplitude by the modulating signal, corresponding peak detectors 58 an 60 (each including a forward biased diode connected through a capacitor to ground) are employed to remove the amplitude modulation components leaving only phase shift information. Thus, I/Q demodulator 56 and peak detectors 58 and 60 collectively form a four-quadrant phase detector. Of course, other types of amplitude detectors may be used in place of peak detectors 58 and 60 including, for example, low pass filters which provide a long term time average of signals rather than a long term peak indication.

Significantly, since the forward signal and the detected signal contain the same desired phase modulation, the peak detector 58, 60 outputs only register the phase shift through the RF upconverter, the transmitter chain 34 (including power amplifier 40), attenuator 46, and downconverter 48. The phase information passed on by the peak detector outputs is not effected by FM or PM signal components.

The phase information of the I and Q signals from the peak detectors 58 and 60 is provided to the I and Q input ports of a second I/Q modulator 62. The output signal from the IF local oscillator 24 is also provided to the local oscillator input of the I/Q modulator 62. The I/Q modulator 62 generates at its RF output a signal whose phase is substantially identical to the phase of the detected signal. The I/Q modulator 62 output is optionally limited by limiter 64 and then passed on to I/Q demodulator 54. Accordingly, I/Q demodulator 54 is provided with identically phased RF and LO input signals which effectively cancels unwanted phase shifts in the detected signal.

The two optional limiters 26 and 64 which may be for example limiting amplifiers, maintain constant local oscillator output levels over varying input-in-phase and quadrature levels. They may also be used to reduce local oscillator ripple effects caused by less than perfect peak detectors 58 and 60. The two optional limiters 26 and 64 are also preferable when strategically placed as shown in the function block diagram of FIG. 2. In those illustrate positions, if the two limiter circuits are matched, any phase shift caused by one limiter cancels out the phase shift generated by the other limiter.

Figure 3:
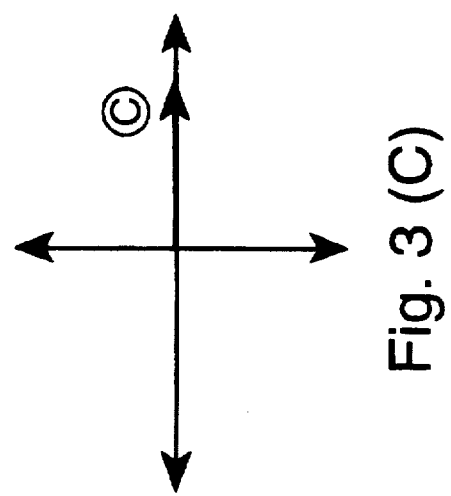
FIGS. 3(A)-3(F) are vector diagrams illustrating the phase of signals at various points in the function block diagram shown in FIG. 2.
Figure 3:
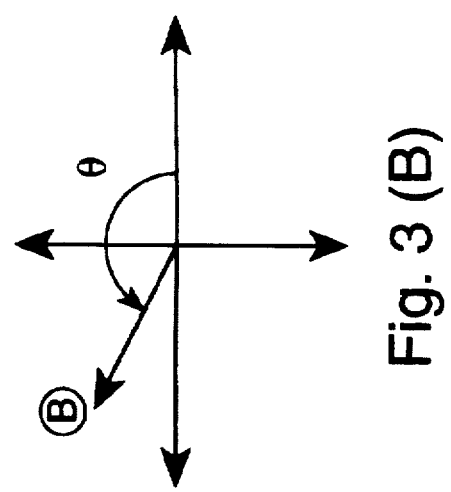
Figure 3:
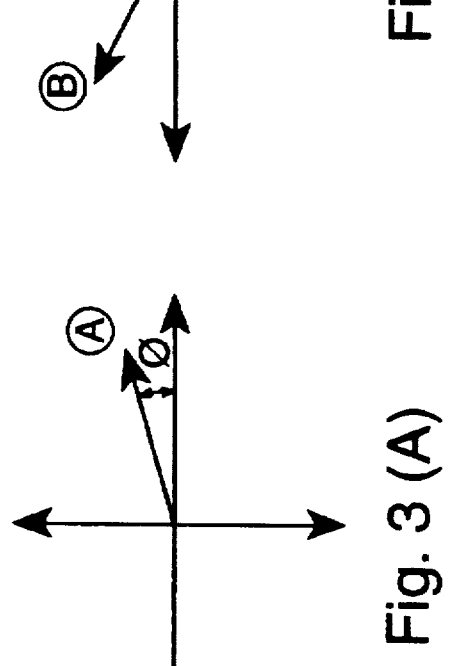
Figure 3:
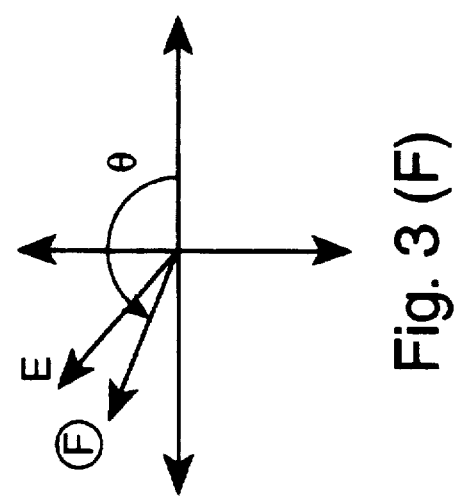
Figure 3:
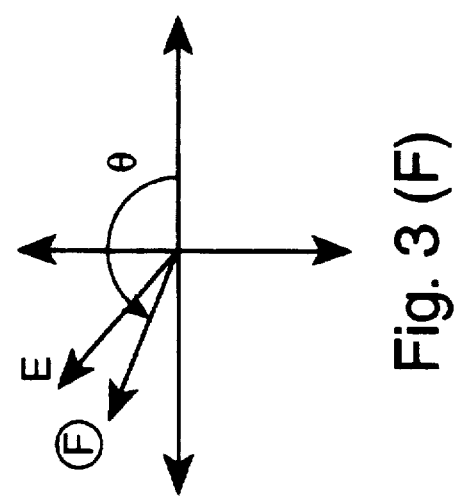
Figure 3:
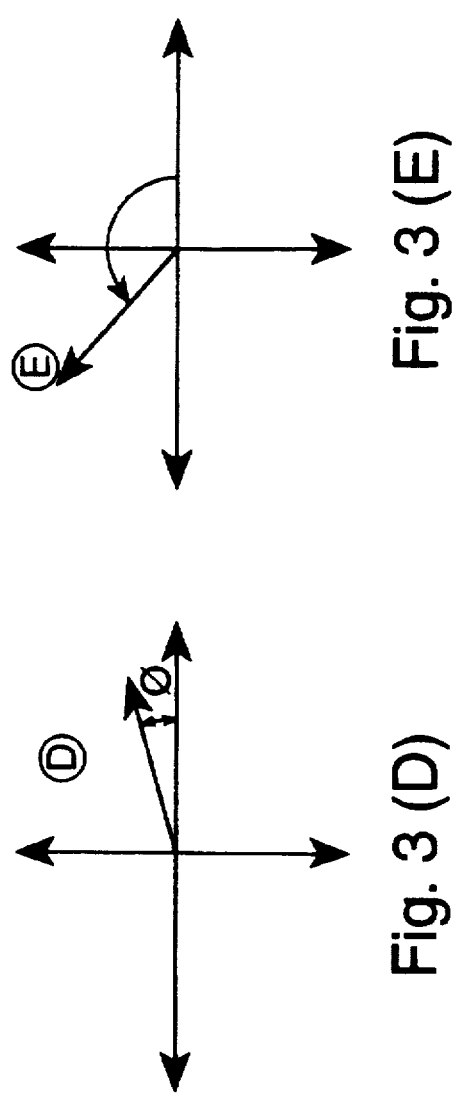

Reference is now made to FIGS. 3(A)–3(F) which show vector phase diagrams in the complex plane for signals at various points A–F identified in the function block diagram of FIG. 2. FIG. 3(A) shows the signal vector corresponding to the forward signal generated by I/Q modulator 28 having some phase angle φ. FIG. 3(B) illustrates the vector diagram of the detected signal B. Note that the phase angle θ of detected signal B is considerably different than the phase angle φ of forward signal A. In other words, there has been an undesired phase shift.

FIG. 3(C) illustrates in the complex plane the vector corresponding to the signal output by the IF local oscillator 24 which, being the original carrier signal, has an initial phase angle of 0. FIG. 3(D) illustrates the phase shift caused by limiter 26 on the local oscillator output signal. Phase angle φ of the limited local oscillator output corresponds to that of the forward signal shown in FIG. 3(A) generated at the RF output port of the I/Q modulator 28.

The output of I/Q demodulator 56 is the vector difference of the forward signal A and the detected signal B, i.e., I/Q demodulator 56 is functioning as a four-quadrant comparator as described above. The peak detectors convert that vector difference to a phase difference. I/Q modulator 62 then effectively vector sums the phase of the local oscillator output C with the phase difference present in the outputs of detectors 58 and 60 to generate vector E shown in FIG. 3(E). The phase of the output signal F from limiter 64 correspond to the vector signal E plus the phase delay generated by the limiter 64 which, as mentioned above, since limiters 26 and 64 are matched, produces a signal F shown in FIG. 3(F). Note that the phase angle θ of vector F corresponds with the phase angle θ of vector B shown in FIG. 3(B).

Thus the present invention provides a method and apparatus by which unwanted phase shifts in the transmitted signal are continuously tracked and cancelled. Preferably, the phase adjuster 50 is implemented using analog type components which among other things provide continuous, accurate, real-time control and correction. Of course, the present invention may be implemented if desired using digital processing techniques and hardware. In that case, appropriate analog-to-digital and digital-to-analog conversion would of course be necessary. Another advantage of the phase adjustment/compensation circuitry shown in FIG. 2 is that the circuitry does not require an initial calibration or recalibration since it is self-calibrating. Moreover, there is no limitation in the accuracy of the phase adjuster 50 because the signals are processed in their original analog format.

Figure 4:
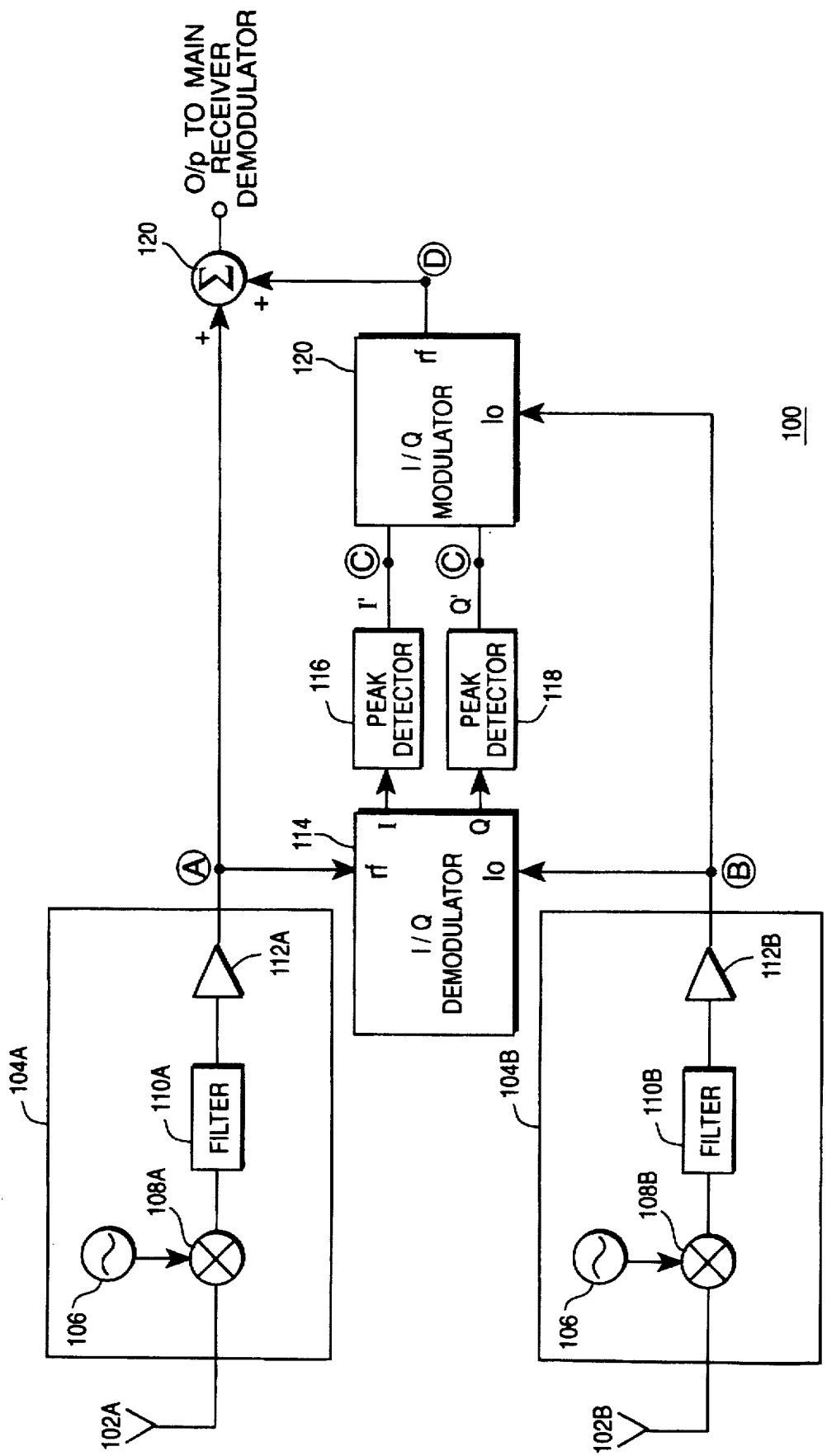
FIG. 4 is a function block diagram of one example, non-limiting application of the present invention to a diversity radio receiver.

FIG. 4 is a function block diagram of an example, non-limiting application of the present invention to a diversity type radio receiver. Of course, the present invention may be applied to other types of radio receivers. For the sake of illustration and brevity only, the following description of the present invention as applied to radio receivers is provided in the context of a diversity-based system.

Diversity radio receiver 100 includes in this example two spatially separated antennas 102a and 102b connected to corresponding front end receivers 104a and 104b. Of course, those skilled in the art will appreciate that more than two diversity antennas and front end receivers may be employed. Each front end receiver 104a and 104b downconverts its received signal to an intermediate frequency (IF) using respective downconverter mixers 108a and 108b both of which are connected to a radio frequency local oscillator 106. The IF frequency outputs are filtered in respective filters 110a 110b and amplified/limited in respective amplifiers/limiters 112a and 112b.

The IF signal output from front end receivers 104a and 104b at signal points A and B differ in phase; that phase difference is also changing with time. The IF signals at points A and B are provided to the RF and LO inputs of an I/Q demodulator 114. I/Q demodulator 114 in conjunction with respective peak detectors 116 and 118 function as a four-quadrant phase comparator. The peak detector outputs I' and Q' are provided to the I and Q inputs of I/Q modulator 120. I/Q modulator 120 also receives as its local oscillator input one of the two IF signals A or B (IF signals from the second diversity receiver 104b is shown connected to the LO input of I/Q modulator 120 for purposes of illustration).

The I/Q demodulator 114 continuously detects in real time the changing phase difference between the IF signals at points A and B. I/Q modulator 120 acts as a phase shifter continuously rotating in real time the phase of IF signal B to match the phase of IF signal A. The RF output of IQ modulator 120 indicated as signal point D is combined with IF signal A in a summer 120 which may preferably be a weighted summer. The composite signal generated by summer 120 is then routed to the main receiver demodulator.

Figure 5:
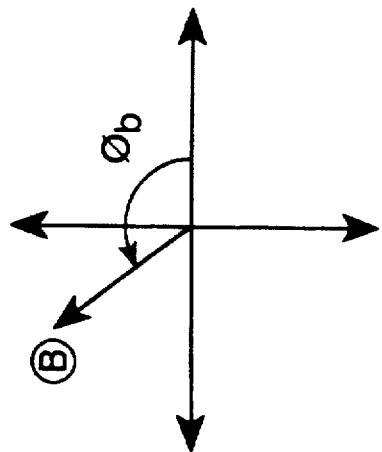
FIGS. 5A-5D are vector diagrams illustrating the phase of signals at various points in the function block diagram shown in FIG. 4.
Figure 5:
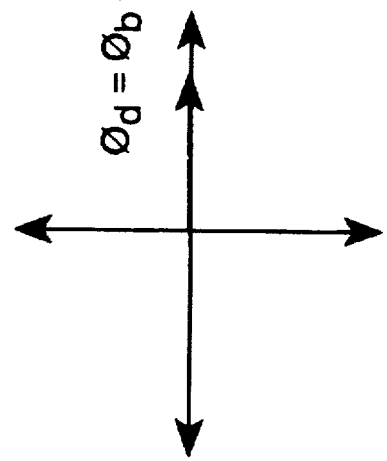
Figure 5:
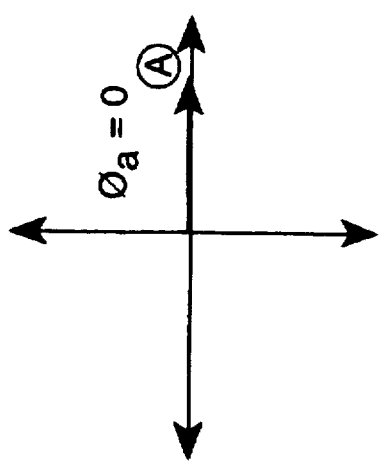
Figure 5:
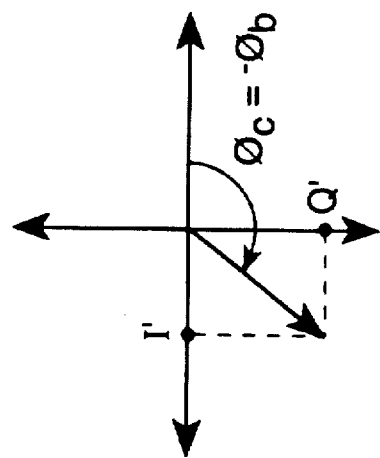

FIGS. 5A–5D show vector phase diagrams in the complex plane for signals at various points A–D identified in the function block diagram of FIG. 4. FIG. 5A shows the signal vector corresponding to the first IF signal generated by front end diversity receiver 104a having a phase angle $\theta_a$ of 0°. FIG. 5B illustrates the vector diagram of the IF signal generated by front end diversity receiver 104b. Note that the phase angle $\theta_b$ of the second IF signal is considerably different than the phase angle $\theta_a$. In other words, there is an undesired phase shift between the diversity received IF signals.

FIG. 5C illustrates in the complex plane a vector resulting from the vector sum of peak detector outputs I' and Q'. The resultant vector has a phase angle $\theta_c$ which is opposite in sign or direction but of equal magnitude to $\theta_b$. As described above, I/Q modulator 120 functions as a phase shifter or phase rotator in the sense that it receives the second IF signal B shown in FIG. 5B having a phase angle of $\theta_b$ and rotates that vector by the phase difference reflected in the vector sum of I', Q' provided at the inputs of the I/Q modulator 120. The end result is a vector output as shown in FIG. 5D whose phase angle $\theta_d$ is zero in accordance with the following equation:

$$\theta_d = \theta_b + \theta_c \text{(where } \theta_c = -\theta_b) = 0°.$$

Accordingly, vector A and vector B are phase aligned and can be added without destructive interference.

Accordingly, this advantageous application of the present invention to diversity receivers allows two or more diversity receive signals to be additively combined in proper phase alignment which is particularly beneficial under same-signal conditions to provide significant increase in the signal to noise ratio of the demodulated signal.

Although a specific example embodiment of the present invention has been disclosed along with certain alternatives, it will be recognized by those skilled in the art that additional variations in form and detail may be made within the scope of the following claims. For example, even though the present invention has been implemented using analog type circuitry, those skilled in the art will appreciate that one or more programmed computers and/or digital signal processing circuitry may also be employed.

What is claimed is:

1. Apparatus comprising:
    a local oscillator for generating a local oscillator signal;
    first and second combiners receiving an in-phase signal and a quadrature signal, respectively;
    a first quadrature modulator modulating in-phase and quadrature signals received from the first and second combiners onto the local oscillator signal to generate a forward signal;
    a power amplifier receiving and amplifying the forward signal;
    an antenna for transmitting the amplified signal;
    a detector detecting the transmitted signal and producing a detected signal;
    a phase adjuster, receiving signal produced by the local oscillator and the detector, adjusting the phase of the local oscillator signal to that of the detected signal; and
    a first quadrature demodulator, coupled to the phase adjuster and the detector, demodulating the detected signal in accordance with the adjusted local oscillator signal to generate feedback in-phase and quadrature signals that are combined in the first and second combiners, respectively,
    wherein the phase adjuster includes:
        a second quadrature demodulator having the forward signal connected to one input port and the detected signal connected to a second input port and generating second in-phase and quadrature signals;
        first and second detectors for processing the second in-phase and quadrature signals, respectively; and
        a second quadrature modulator, connected to the local oscillator, for receiving output signals from the first and second detectors and generating the phase adjusted local oscillator signal.

2. Apparatus in claim 1, wherein the phase adjuster compares the forward and detected signals to determine a phase difference between the forward and detected signals and wherein the phase difference is used to adjust the phase of the local oscillator signal to cancel the phase difference.

3. Apparatus in claim 1, wherein the first and second detectors include first and second peak detectors, respectively.

4. Apparatus in claim 1, wherein the first and second detectors include first and second low pass filters, respectively.

5. Apparatus in claim 1, further comprising:
    a first limiter connected to the local oscillator and generating a limited signal input to an input port of the first quadrature modulator, and
    a second limiter connected to an output port of the second quadrature modulator for limiting the phase adjusted local oscillator signal.

6. Apparatus in claim 5, wherein the first and second limiters are matched so that a phase shift caused by one limiter is offset by the other limiter.

7. Apparatus in claim 1, wherein the local oscillator is an intermediate frequency (IF) local oscillator, the apparatus further comprising:
    a radio frequency (RF) local oscillator for generating an RF local oscillator signal;
    an RF upconverter receiving as inputs the forward signal and the RF local oscillator signal and generating a forward RF signal fed to the power amplifier; and
    an RF downconverter coupled to the detector and receiving as inputs the detected signal and the RF local oscillator signal for downconverting the detected signal to an intermediate frequency.

8. Apparatus in claim 1, wherein the phase adjuster continuously tracks undesired phase differences between the forward signal and the detected signal and in conjunction with the first quadrature demodulator cancels the undesired phase differences.

9. In a Cartesian, in-phase and quadrature (I/Q) radio frequency (RF) transmission system, a method comprising the steps of:
    modulating a carrier signal with a difference signal based on an input signal;
    transmitting the modulated carrier signal;
    detecting the transmitted signal and producing a detected signal; and
    demodulating the detected signal and generating a feedback signal;
    determining a difference between the input signal and the feedback signal to generate the difference signal; and
    compensating for phase error in the detected signal using the carrier signal, wherein the modulating step includes:
        modulating the carrier signal using a difference between an in-phase and quadrature components of the input and feedback signals, and
    wherein the compensating step includes:
        In-phase and quadrature (I/Q) demodulating the detected signal using the carrier signal as a reference signal and generating in-phase and quadrature (I/Q) demodulated outputs;
        In-phase and quadrature (I/Q) modulating the in-phase and quadrature (IQ) demodulated outputs using the carrier signal as a reference to generate a compensated carrier signal; and
        In-phase and quadrature (I/Q) demodulating the detected signal using the compensated carrier signal as a reference to generate in-phase and quadrature feedback component;
        limiting the amplitude of the carrier signal before the carrier signal is modulated using the difference between the in-phase and quadrature components of the input and the feedback signals, and
        limiting the amplitude of the compensated carrier signal.

10. The transmission system in claim 9, the compensating step further comprising:
    adjusting the phase of the carrier signal to compensate for phase changes introduced to the modulated carrier signal by the transmitting step.

11. The transmission system in claim 10, the compensating step further comprising:
    determining a phase difference between the modulated carrier signal and the detected signal, and
    adjusting the carrier phase using the phase difference.

12. A radio transmitter comprising:
    a local oscillator for generating a local oscillator signal;
    an I/Q modulator for modulating an input signal having in-phase (I) and quadrature (Q) components onto the local oscillator signal to generate a forward signal;
    a power amplifier receiving and amplifying the forward signal;

an antenna for transmitting the amplified signal;

a detector for detecting the transmitted signal;

a phase adjuster, connected to the local oscillator and to the detector, for substantially continuously detecting and cancelling undesired phase shifts in the detected signal;

a quadrature demodulator, connected to the phase adjuster for demodulating the detected signal in accordance with the local oscillator signal whose phase is adjusted by the phase adjuster to generate feedback in-phase and quadrature signals that are combined in first and second combiners with the input signal I and Q components, respectively;

wherein the phase adjuster comprises:

a second quadrature demodulator having the forward signal connected to one input port and the detected signal connected to a second input port and generating second in-phase and quadrature signals;

first and second detectors for removing the amplitude fluctuations of the second in-phase and quadrature signals, respectively; and a second quadrature modulator connected to the local oscillator and receiving output signals from the first and second detectors and generating the phase adjusted local oscillator signal.

* * * * *